(12) United States Patent
Allee et al.

(10) Patent No.: US 6,255,979 B1
(45) Date of Patent: *Jul. 3, 2001

(54) CMOS FLASH ANALOG TO DIGITAL CONVERTER COMPENSATION

(75) Inventors: David R. Allee; Bart R. McDaniel, both of Phoenix, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,116

(22) Filed: Feb. 24, 1999

(51) Int. Cl.[7] ....................................................... H03M 1/36
(52) U.S. Cl. ........................................... 341/159; 341/155
(58) Field of Search .................................... 341/155, 144, 341/156, 159, 161, 118

(56) References Cited

U.S. PATENT DOCUMENTS

| 4,580,131 | * | 4/1986 | Seiler ..................................... 341/144 |
| 5,231,399 | * | 7/1993 | Gorman et al. ....................... 341/159 |
| 5,355,135 | * | 10/1994 | Redfern ................................. 341/156 |
| 5,416,484 | * | 5/1995 | Lofstrom ............................... 341/159 |
| 5,563,598 | * | 10/1996 | Hickling ................................ 341/155 |
| 5,877,718 | * | 3/1999 | Andoh et al. ......................... 341/155 |
| 5,990,814 | * | 11/1999 | Croman et al. ....................... 341/118 |

OTHER PUBLICATIONS

Rudy van de Plassche, Integrated Analog to Digital Converters and Digital to Analog Converters, Kluwer Academic Press, Boston 1994, pp. 126–128.

* cited by examiner

*Primary Examiner*—Peguy JeanPierre
(74) *Attorney, Agent, or Firm*—Blakely, Sokoloff, Taylor & Zafman LLP

(57) ABSTRACT

An analog-to-digital converter (ADC) is provided. The analog-to-digital converter includes a plurality of differential comparators. For each of the plurality of differential comparators the ADC receives differential input signals and differential reference signals and generates an output signal. The ADC also includes a self-calibration circuit to receive from each of the plurality of differential comparators the output signal. In response to the output signal, the self-calibration circuit generates a self-calibration signal. The ADC further includes an adjustable reference signal generator to provide the differential reference signals based on the self-calibration signal.

20 Claims, 5 Drawing Sheets

CM OS FLASH ANALOG TO DIGITAL CONVERTER COMPENSATION

BACKGROUND

I. Field

The present invention relates to the field of electronic circuits. More particularly, the present invention relates to analog-to-digital converters.

II. Background Information

Recently there has been a trend in integrating data converters, such as analog-to-digital converters (ADC), with digital Complementary Metal Oxide Semiconductor (CMOS) circuits fabricated by way of digital CMOS processes. Consistent with higher levels of integration, with smaller system size, and with lower system packaging cost, integration of data converters with digital CMOS is desirable. However, problems may arise when ADCs are integrated with digital CMOS circuits. Frequent digital switching, that takes place in the digital CMOS circuits, may cause noise that tends to corrupt performance of the integrated ADC.

Simultaneous switching of many digital devices, at the clock edges characteristic of digital integrated circuits (IC), may create voltage spikes in the power and ground lines as well as inject current into the substrate. While CMOS digital circuits may be substantially immune to the digital switching noise, performance of analog circuits is degraded in the "mixed mode" integrated analog and digital environment.

Conventional high-speed flash ADCs typically use an auto zeroed architecture to reduce offset errors inherent in component mismatch. These auto-zeroed techniques typically require that well-matched linear capacitors be formed using a double polysilicon CMOS process. Because purely digital CMOS processes generally utilize only a single level of polysilicon, it is difficult to obtain highly linear, well-matched capacitors on that digital CMOS process. Typically, high speed flash ADCs use single-ended circuitry. The single-ended circuitry in these conventional flash ADCs make signals susceptible to the injection of digital switching noise. Therefore, there is a problem with ADCs where noise due to digital switching substantially affects the ADCs performance and where component mismatch contributes to offset errors.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

The present invention provides, in one embodiment thereof, a Complementary Metal Oxide Semiconductor (CMOS) flash analog-to-digital converter (ADC). In the following description, numerous specific details are set forth to provide a thorough understanding of the present invention. However, one having ordinary skills in the art may be able to practice the invention without the specific details. In some instances, well-known circuits, structures and techniques have not been shown in detail to avoid obscuring the present invention.

One embodiment of an analog-to-digital converter (ADC), of the present invention, includes a plurality of fully differential comparators. Each differential comparator receives differential input signals and differential reference signals and in response thereto generates an output signal. The ADC also includes a self-calibration circuit that receives from each of the differential comparators of the plurality of fully differential comparators an output signal. In response to the output signal, the self-calibration circuit generates a self-calibration signal. The ADC further includes an adjustable reference voltage generator that receives the self-calibration signal and in response thereto generates the differential reference signals. The self-calibration circuit fine tunes the differential reference signals by adjusting the adjustable reference signal generator for each comparator. The fully differential comparators of the ADC mitigate digital switching noise otherwise affecting the ADC had the differential comparators been singled-ended. In the ADC of the embodiment of the present invention described herein, transient signals coupling a differential signal appear as comon-mode signals—both polarities of the differential signal rise or fall together. The ADC is thus, to a high degree, insensitive to common-mode signals. The self-calibration circuit compensates for device mismatch and circuit non-linearities displayed when a differential signal is applied to the ADC.

Embodiments of the present invention allow expansion of the functionality of digital ICs, in particular of microprocessors and micro controllers, making it possible to convert high frequency differential analog signals to digital signals on chip for further digital processing. The flash ADC according to one embodiment of the present invention is not limited in resolution by component mismatch. The fully differential structure reduces the susceptibility of the converter to pervasive digital switching noise present in a microprocessor. Digital switching noise has been a limiting factor in the incorporation of data converters on digital ICs, microprocessors and microcontrollers.

Figure 1:
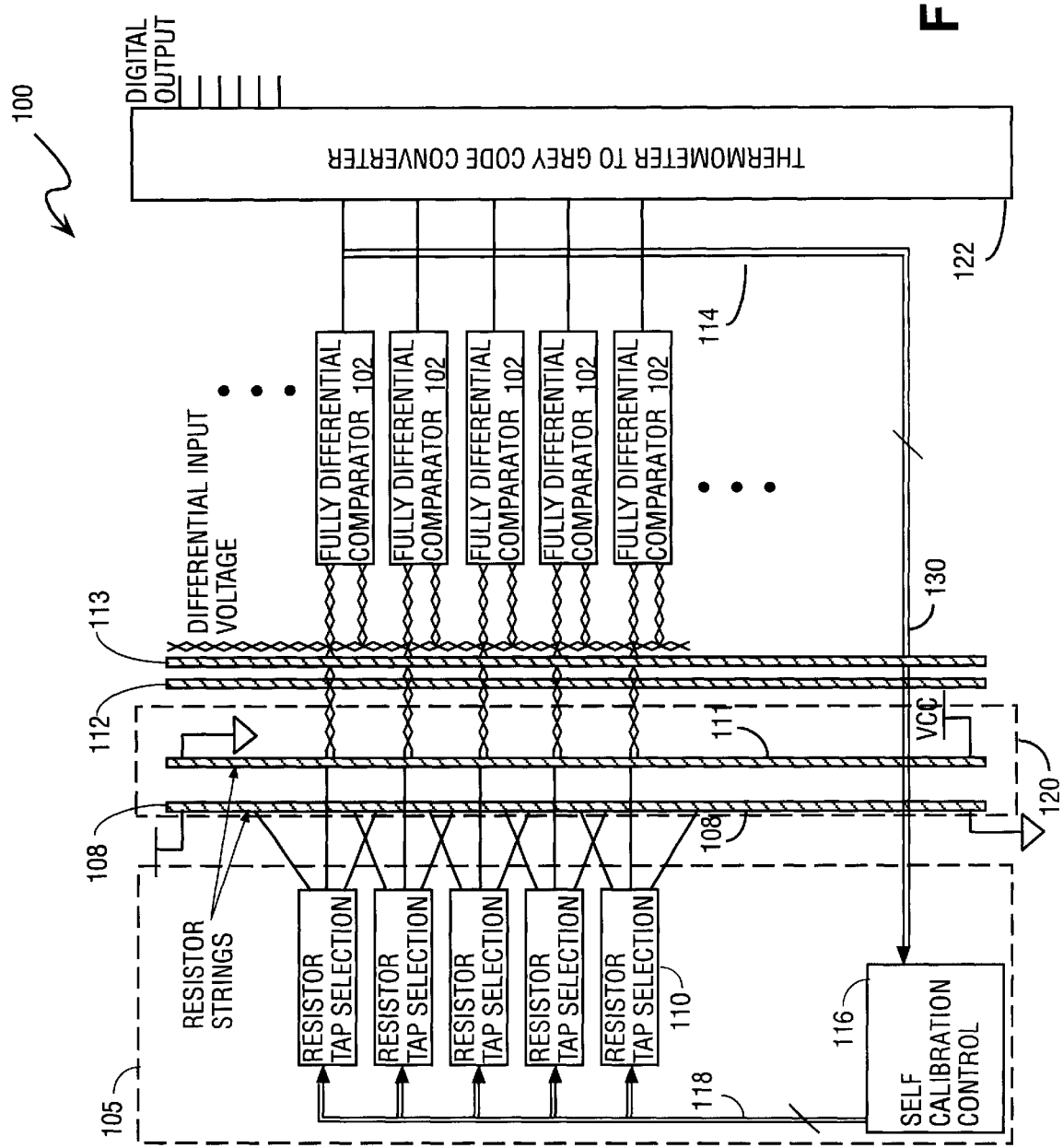
FIG. 1 is a diagram that illustrates an analog-to-digital converter according to one embodiment of the present invention.

FIG. 1 illustrates an ADC 100 according to one embodiment of the present invention. ADC 100 is a fully differential flash analog-to-digital converter compatible with digital CMOS processes. By way of example, the ADC 100 according to one embodiment of the present invention may be compatible with Intel Corporation's digital CMOS processes. For example, ADC 100 may be implemented on a same CMOS micro-chip with a digital CMOS circuit, such as an Intel Corp. microprocessor. One embodiment of the ADC according to the present invention uses Metal Oxide Semiconductor Field-Effect Transistors (MOSFET) making the ADC completely compatible with purely digital CMOS processes. Applications of the ADC include, but are not limited to, the digitization of video signals for multimedia personal computers (PC) and possibly design of wireless CMOS circuits where a high speed data converter is used to digitize an Intermediate Frequency (IF) signal although the invention is not limited in scope in this respect.

ADC 100 includes a plurality of fully differential comparators 102. In one embodiment of the present invention, ADC 100 includes $2_n$ fully differential comparators for n-bit conversion. In the embodiment of the present invention described herein, there are 64 fully differential comparators for a 6-bit conversion. Each comparator 102 receives a pair of differential input signals that are, voltage signals in one embodiment, and a pair of differential reference voltage signals. Each comparator 102 compares the magnitude of the differential input signal with the magnitude of the differential reference signal at a given point in time.

Comparators 102 may be self-calibrated one at a time. For a given comparator, an input signal equal to a desired reference voltage is applied. The output signal of each comparator 102 is not likely to be at the transition point between two stable states because of random mismatch between the transistor characteristics of ADC 100. This leads to input referred offset. The offset may be minimized by adjusting a reference voltage until the comparator switches states from "0" logic to a logic "1". The slightly modified reference voltage compensates for the input referred offset. The comparator then switches at an input voltage nearly equal to the desired reference voltage.

ADC 100 further includes an adjustable reference generator 120 (shown in dotted lines) to adjust the reference voltage. The adjustable reference signal generator 120 includes a dual resistor string that is made up of a first resistor string 108 and of a second resistor string 111. Each resistor string includes a series of substantially identical "resistor segments" that produce consistent voltage drops along the resistor string when the resistor string is biased at a specific voltage. In one embodiment of the present invention described herein, each "resistor segment" is comprised of four sub-segments. This leads to $2^{n+2}$ sub-segments along the resistor string for a n-bit conversion. Each of the resistor strings is biased between an upper rail voltage Vdd, which may be approximately 5 volts or less, process dependent on maximum Vdd, and a lower rail voltage which may be the ground potential. The concept of reference voltage generation by means of a resistor string is well-known in the art.

ADC 100 also includes a self-calibration circuit 105. In one embodiment of the present invention, the self-calibration circuit 105 includes a plurality of resistor tap selection circuits 110 coupled to the adjustable reference signal generator 120. Each resistor tap selection circuit corresponds to one comparator 102 of the plurality of the comparators. The resistor tap selection circuits 110 select a pair of tap points on each of the two resistor strings 108 and 111 of the adjustable reference signal generator 120. Therefore, a pair of differential reference signals is provided to each generator 120 corresponding to a respective comparator 102.

In the embodiment of the present invention where the adjustable reference signal generator 120 includes dual resistor strings, resistor tap positions, for each comparator, are adjusted by resistor tap selection circuit 110. For each comparator 102 there is one resistor tap selection circuit 110. A correct tap position for each comparator may be stored in an m-bit register (see, for example, tap point storage register 442 of FIG. 4), located in each resistor tap selection circuit 110. Depending on a value of "m" there are $2^m$ possible tap positions that may be selected as voltage references for a specific comparator in this embodiment. In the embodiment of the present invention described herein, m is equal to 3. The correct tap position is provided by a control-for-self-calibration circuit 116. In one embodiment of the ADC 100 of the present invention, the control for self-calibration circuit 116 receives at an input port thereof the output voltage signals from the fully differential comparator circuits 102 via bus 130 and responsive thereto generates self-calibration signals during the self-calibration process.

The control for self-calibration circuit 116, in this embodiment, includes a state machine (not shown) that receives information (output signals) from the output port of the fully differential comparators 102. For each comparator 102, the state machine generates via bus 118 self-calibration information, in the form of signals, to the corresponding resistor tap selection circuit 110. During the calibration procedure, the comparators 102 are tuned to the applied input voltage by adjusting the tap position of the reference voltage.

Figure 2:
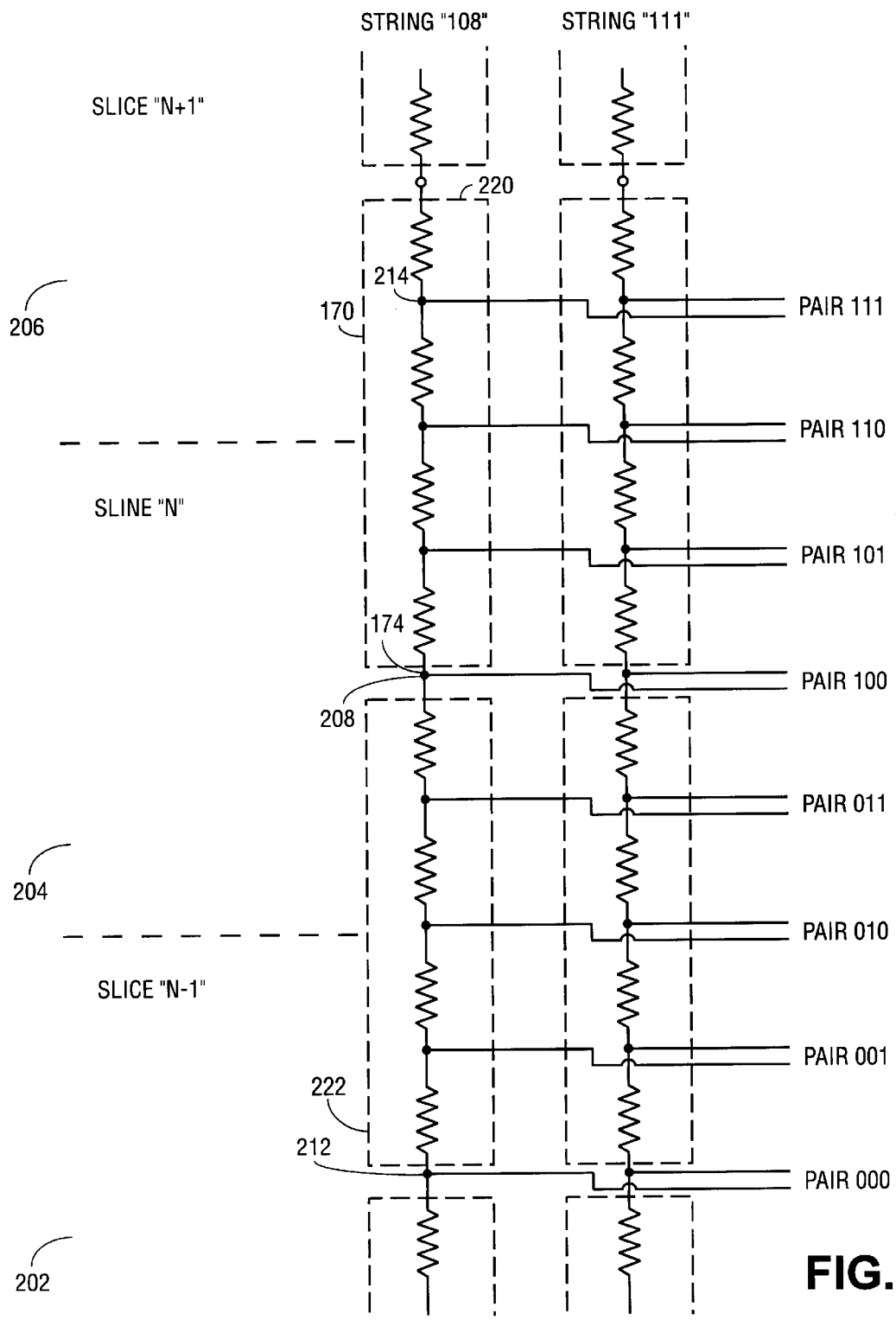
FIG. 2 is a diagram that illustrates a portion of two resistor strings according to an embodiment of the present invention.

FIG. 2 is an illustration of a block diagram of a portion of the two resistor strings 108 and 111. For each comparator 102 (not shown in this figure) there is one slice corresponding thereto. The slice includes a dedicated portion of the pair of resistor strings corresponding to the respective comparator 102. FIG. 2 illustrates slice "n=1" 202, slice "n" 204 and slice "n+1" 206. Each slice may choose one of eight tap points centered about a "nominal" tap point of the slice. For example, for slice 204 the nominal tap point 208 is positioned in the middle of the four sub-segments of slice 204. Each slice may choose one of eight tap points centered about the nominal tap point 208 of the slice. The nominal tap point corresponds to binary address "100" of a tap position register (not shown in the figure) that stores an "address" pointing to a tap point selected for a particular slice. The full range of selectable taps for slice 204, ranges from position "000", corresponding to tap point 212, which is one full least significant bit (or resistor segment) below the nominal tap value, to binary address "111", corresponding to tap point 214, which is ¾ least significant (segment) above the nominal tap value. Accordingly, for each slice there are eight selectable pairs of resistor sub-segments. These eight resistor sub-segments are part of two resistor segments 220 and 222 (shown within dotted lines). However, the present invention is not limited to this embodiment of the resistor string.

Full scale voltage is applied to opposite ends of each resistor string. In this way, differential reference voltages may be obtained with taps that are adjacent to each other on opposite resistor strings, by means of careful physical placement of the two resistor strings. Induced digital switching noise, on the micro-chip due to substrate currents may affect both taps in substantially the same way. The differential reference could have a shift in its common mode voltage point, but this common mode may be substantially rejected by the input differential pair of the comparator. Furthermore, some forms of integral non-linearity in the resistor strings are largely reduced by the differential arrangement. In particular, if the integral non-linearity is symmetrical about the mid-voltage point of the string, the differential structure reduces and nearly eliminates the nonlinearity effect of the voltage along the tap points.

Figure 3:
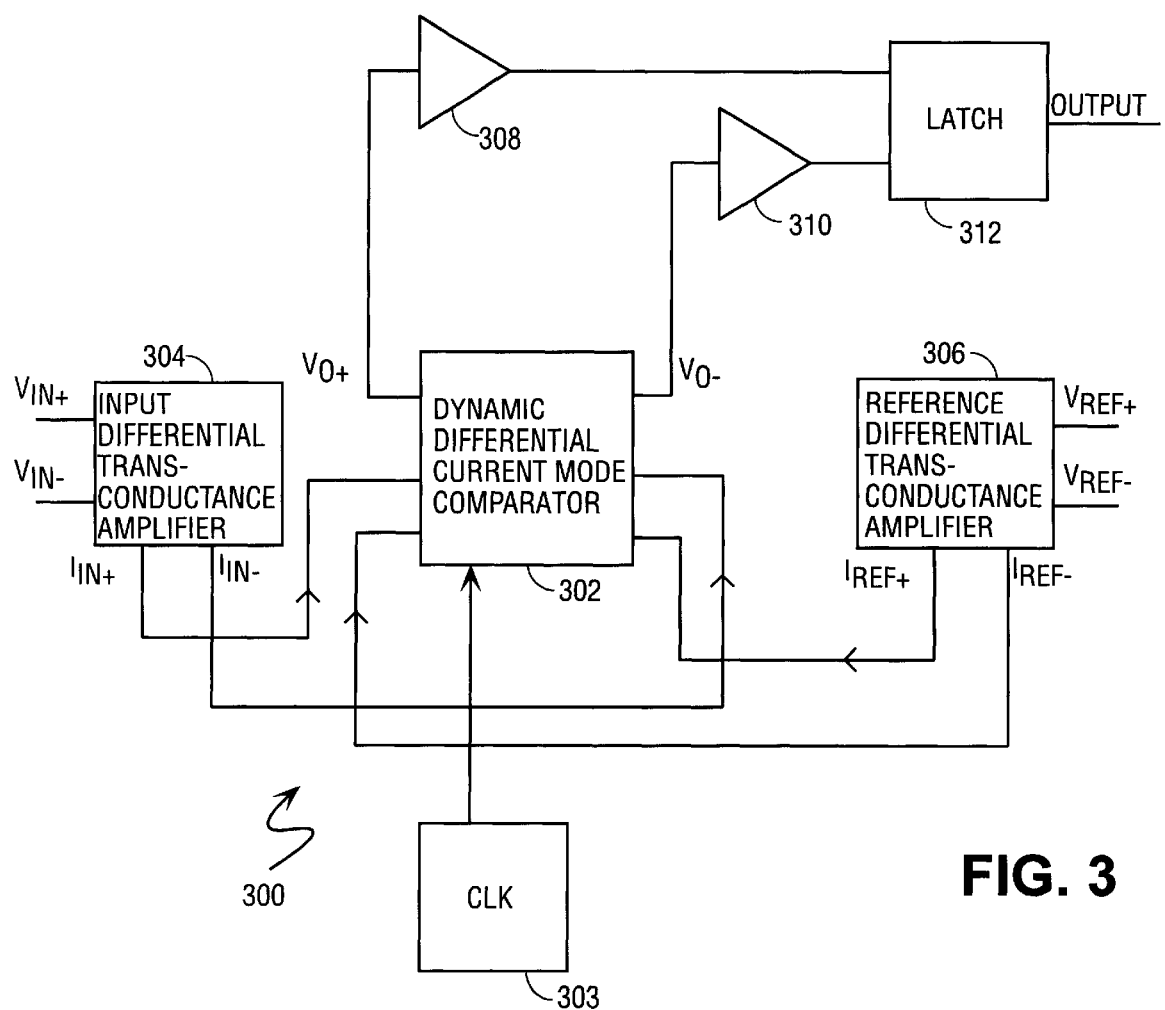
FIG. 3 is a diagram that illustrates a fully differential comparator of the analog-to-digital converter according to one embodiment of the present invention.

FIG. 3 illustrates in block diagram form a fully differential comparator 300 of the ADC 100 according to one embodiment of the present invention. In the embodiment of the present invention described herein, the fully differential comparator 300 includes a dynamic-differential-current-mode comparator 302, an input differential transconductance amplifier 304 and a reference differential transconductance amplifier 306. The input differential transconductance amplifier 304 receives at input gates thereof a pair of differential input signals $V_{in+}$ and $V_{in-}$. In response to these signals the input differential transconductance amplifier 304 converts these signals into proportional differential current signals $I_{in+}$ and $I_{in-}$. Similarly, the second or reference differential transconductance amplifier 306 receives at input gates thereof voltages $V_{ref+}$ and $V_{ref-}$ and translates these signals into differential currents Iref+ and Iref−. The differential currents are fed into standard dynamic differential current mode comparator 302 which is sampled by a clock signal (not shown) from sampling clock 303. The differential current mode comparator 302 compares the magnitude of the currents $I_{in+} + I_{ref-}$ and $I_{in-} + I_{ref+}$. In this way, the currents compared have a common-mode current substantially equal to the tail current of the differential pairs in the differential transconductance amplifiers 304 and 306. "Tail current" is the common bias current that is provided to a differential pair of transistors, e.g., to a differential pair of transistors in the input of an operational amplifier or comparator. The sum of currents through the two input devices is always equal to the "tail current". The output signals $V_{out+}$ and $V_{out-}$ of the standard current mode comparator 302 generated on a transition of sampling clock 303 are then fed through buffers 308 and 310 to the S-R latch 312 which holds the output signal until the next comparison takes place. An S-R latch may be thought of as a set/reset flip-flop in which activating the "S" input will switch (or set) the latch to one stable state and activating the "R" input will switch (or reset) the latch to the other state.

Figure 4:
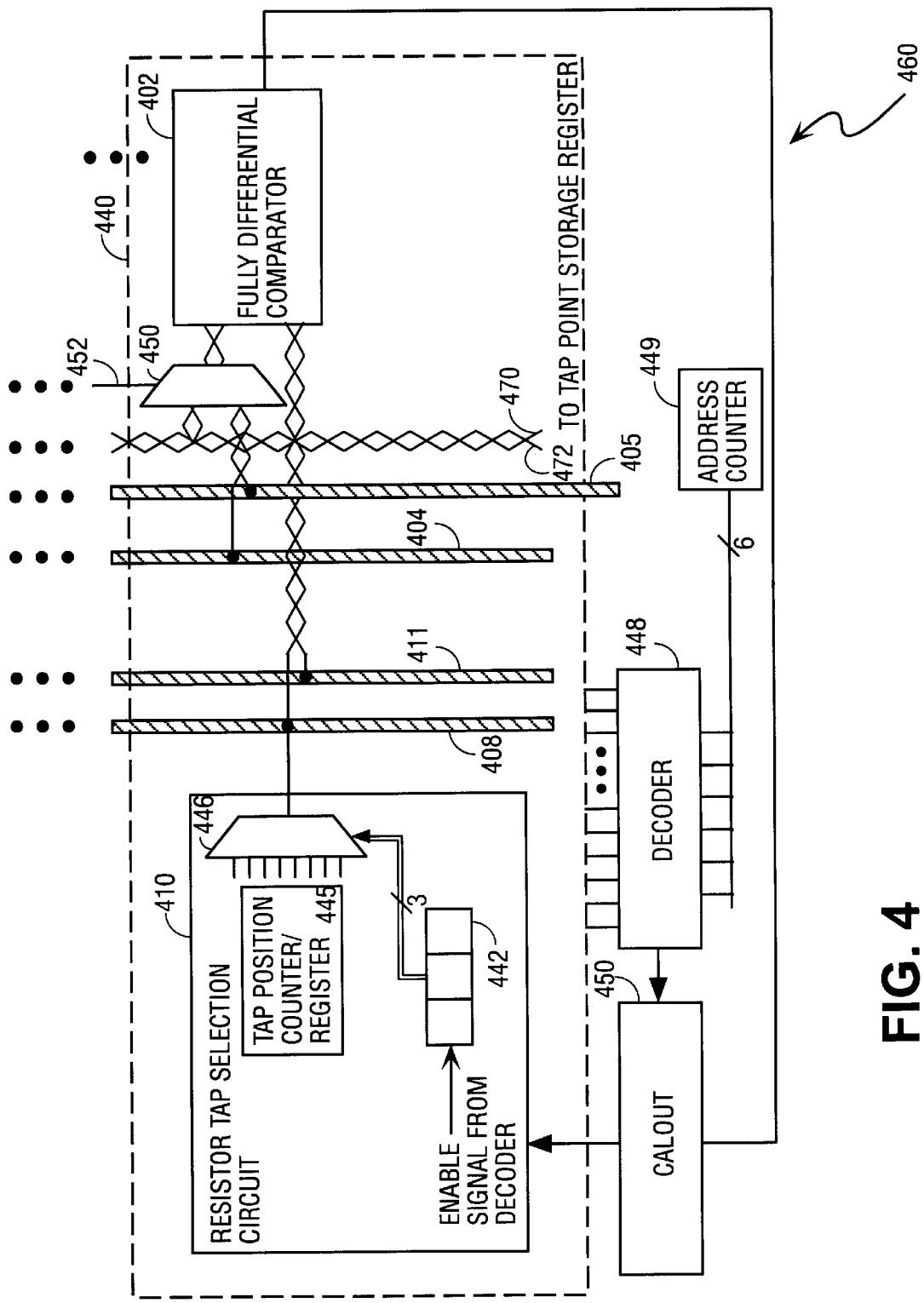
FIG. 4 is a diagram that illustrates a hardware implementation of a slice of an analog-to-digital converter according to one embodiment of the present invention.

FIG. 4 illustrates in block diagram form a hardware implementation of a "slice" 460 of the ADC 400 in connection with the self-calibration circuit according to one embodiment of the present invention. In the embodiment of the present invention described herein there are 64 comparators and resistor tap selection circuits, as the ADC described herein is a 6-bit flash ADC. A slice 460 includes one of the 64 fully differential comparators, its corresponding self-calibration circuit including a resistor tap selection circuit 410 and corresponding reference register string portions 408 and 411 of the adjustable voltage reference generator. In this embodiment, the hardware for each slice 460 is replicated for each 64 slices of the ADC described herein. Each slice is independently selectable, during an auto calibration mode, in a prescribed ascending order. The calibration cycle allows for the best choice of differential tap points along the "sub-segments" available for a specific comparator to use as a reference voltage to reduce the input offset effects of that comparator.

Resistor tap selection circuit 410 includes a tap point storage register 442 which, in the embodiment of the ADC according to the present invention described herein, is a 3-bit wide register. The tap point storage register 442 stores a "value" of the tap point selection. The "value" stored in the tap point storage register 442 represents a point, along the reference resistor strings 408 and 411, to be coupled to the reference input of a comparator 402. The term "value" is used because when the resistor tap points to a tap point corresponding to the stored "value", a reference voltage of the specific value is provided by the resistor strings portions 408 and 411 to the input ports of comparator 402. The corresponding register string portions 408 and 411 include eight tap points, for the slice discussed herein that has the 3-bit register 442 6-bit slice address. These 8 tap points may be selected by a multiplexor 446. The tap point storage register 442 is coupled to a select gate of multiplexor 446 to cause selection of 1 of 8 tap points of the pair of the portions of resistor strings 408 and 411 corresponding to register resistor tap selection circuit 410.

Decoder 448 selects the desired tap storage register 442 in a slice of interest based on a 6-bit slice address set by an Address Counter/Register 449 that individually selects a register tap selection circuit 410 of one of the 64 slices. In response to this address, decoder 448 generates at an output thereof a set of address select lines that select 1 of the 64 slices, thereby enabling the tap point storage register of the slice of interest. A calibration output (calout) circuit 450 digitally monitors the self-calibration operation on a per-slice basis, and signals to the self-calibration control circuit 116, shown in FIG. 1, when the correct tap point has been selected for the chosen slice. The calout 450 and self calibration circuits 116 may be easily implemented by persons having ordinary skill in the art based on the preceding discussion and the discussion that follows in connection with the process of self-calibrating an ADC.

In one embodiment of the present invention, the register tap selection circuit 410 includes a tap position counter/register 445 that counts up to 8 positions. The selected position indicates to the slice 460 which reference resistor tap point pair, 1 of 8 choices, to use as reference input signals to comparator 402.

Typically, at power on, the process of calibration starts with the first comparator from the bottom that corresponds to the "lowest" quantized level of 64 available levels. The control circuit 116 shown in FIG. 1 senses the digital output signal of the fully differential comparator and in response changes the value of the resistor tap to minimize the input offset error of that comparator. The same procedure may then be followed for the other comparators, in sequence. With this self-calibration process, the resolution limit of the flash A/D converter described herein is determined at least in part, by the accuracy of the input voltages that are applied during self-calibration. These accurate input voltages could be applied externally. However, a nonvolatile storage device (a storage device whose contents are preserved when its power is off). would be needed to store the values of the calibrated tap positions on chip. In this case, the ADC could be calibrated once, at the factory and the values of the calibrated tap positions could be stored in the non-volatile storage device. During the calibration procedure, the comparators are tuned to the applied input voltage by adjusting the tap position of the reference voltage according to the value stored in the non-volatile storage device, to reduce the input offset error.

Without non-volatile memory, however, the ADC is calibrated at each power up. Providing precise input voltages for self-calibration is not practical in the field. These input voltages may be provided on chip by a pair of reference resistor strings 404 and 405 also referred to as master reference resistor strings. The master reference resistor strings 404 and 405 may provide the desired input voltages for self-calibration. A multiplexor 450 may select between using the normal ADC input differential signal mode and the Master Resistor tap input signals, from the master reference pair of resistor strings for self-calibration mode.

Multiplexor 450, coupled at its input ports thereof to both master reference pair 404 and 405 and to differential input voltage pair 470 and 472. Multiplexor 450 receives at a select gate thereof, a select signal via line 452. Depending on the select signal, which indicates whether the ADC is in a normal ADC mode or in a self-calibration mode, multiplexor 450 selects at an output port thereof one of the Master Reference pairs 404 and 405, and the normal input signals from lines 470 and 472.

The present invention also provides in one embodiment thereof, a process for self-calibrating an ADC. The self-calibrating process chooses an improved possible voltage reference signal or ("tap point") to be used with each corresponding comparator in the ADC according to one embodiment of the present invention. In the embodiment discussed herein there are 64 comparators and 64 selected individual tap points. Calibration may be done on "power up" or "at will" by a host controlling system. Improving the individual tap points allows the minimization of errors due to input referred voltage offsets inherent in analog comparators.

Figure 5:
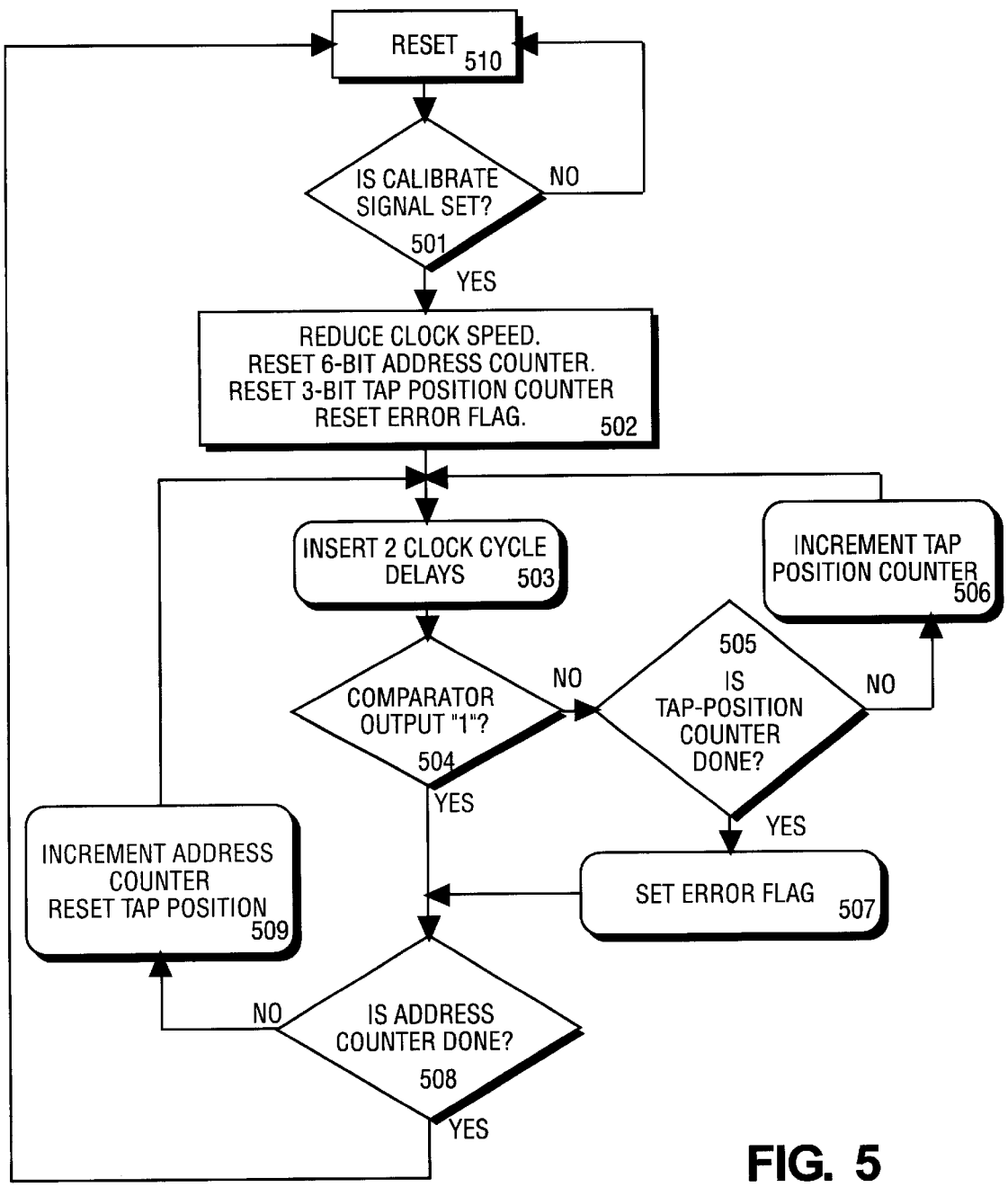
FIG. 5 is a flow chart diagram that illustrates a process for self-calibrating an analog-to-digital converter according to one embodiment of the present invention.

FIG. 5 illustrates a flow chart diagram of a process for self-calibrating an ADC according to one embodiment of the present invention but the present invention is not limited in scope to this embodiment. The process begins at block 501. At this stage, the process checks whether a CALIBRATE signal is received. The CALIBRATE signal sets a state register in a control circuit for self-calibration (not shown), that starts a series of events listed at block 502. The state register may also include a flag indicating that the ADC is busy in a self-calibration mode. At block 502, the clock speed of a clock signal driven to the ADC may be slowed down by a factor of choice to adjust the speed at which the self-calibration circuitry is designed to perform its functions. At this point, the slice Address Register/Counter (6 bit), the Tap Position Register/Counter (3 bit ), and the Error Flag may be reset to a binary "0", value, to start calibrating slice 0 at a lowest tap point position. The error flag indicates a calibration failure, i.e., the comparators output does not flip to a "1", even at the highest value of available tap position.

The process then passes to block 503 where a latency, or delay, of two full clock periods is inserted due to latency of the physical circuits in the calibration circuitry. The process then flows to decision block 504 where the process enters a loop where a comparators output port is checked. The comparators output port, for a specific slice, is monitored to find the lowest tap position on the resistor string that causes a "1" at the output port of the comparator. This tap position is chosen as the comparator threshold point for the slice that is being calibrated. The reference resistor string tap pair is compared with the master resistor string tap pair. The threshold is chosen at the first point where the comparator detects that the magnitude of the differential voltage developed between the reference resistor string tap pair is greater than that developed between the master reference resistor string tap pair.

If the comparators output port is not set to "1" the process flows to decision block 505. At decision block 505 the process checks whether the tap position counter is done counting. If the tap position counter is not done counting, the process flows to block 506 where the tap position counter is incremented. In this case there is at least one more reference resistor tap position to choose for the next comparison. If the tap position counter is done counting the process flows to block 507 where an Error Flag is set. In this case, all reference taps for the respective slice have been cycled through. The highest tap pair is chosen (by default) to select the reference tap pair with the highest differential voltage available to that slice. The Error Flag may be used to report that the calibration cycle encountered at least one slice which was out of the correction range for that slice. One or more errors cause the flag to be set. During the loop of selecting the correct reference tap position, the contents of the tap position counter are stored locally in the tap point storage register upon each increment of the tap position counter/register.

If at decision block 504 the output port of the comparator is at logic "1", the process flows to decision block 508. The process flows to decision block 508 after the cycle of setting the reference resistor tap position is complete. At decision block 508 it is determined whether the Address Counter is done counting. This means that all the 64 slices were calibrated. If the Address Counter is done counting, the process flows to block 510 because all the slices have already been addressed. This signals the end of the self-calibration cycle and results in resetting the self-calibration control circuitry at state 501 and exiting into normal operation mode. In normal operation mode, the differential input signal is applied simultaneously to all 64 comparators and the clock is brought back to the full operational speed. It should be understood that the present invention is not limited to decision related to the output of the comparator being a "1". Persons having ordinary skill in the art may implement the present invention with slight modifications, where decisions are made in connection with the comparators output being at "0" logic.

If the Address Counter is not done counting, the process flows to block 509 where the Address Counter is incremented and the reset tap position counter is reset. This indicates that the threshold has been set for the current slice (that is being calibrated) and it is time to move to the next slice up, by incrementing the Address Counter/Register. From block 509 the process flows back to block 503 and goes through the tap position selection loop for the next slice.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. An analog-to-digital converter (ADC) comprising:
   a plurality of differential comparators, each differential comparator of the plurality of differential comparators configured to receive differential input signals and differential reference signals and to generate an output signal;
   a self-calibration circuit to receive from each differential comparator of the plurality of differential comparators the output signal and responsive thereto to generate a self-calibration signal; and
   an adjustable reference signal generator to provide the differential reference signals based on the self calibration signal.

2. The ADC of claim 1, wherein the output signal is an output voltage and the self calibration circuit includes a self-calibration control circuit to receive the output voltage and responsive thereto to generate the self-calibration signals.

3. The ADC of claim 2, wherein the self-calibration circuit further includes a pair of master resistor strings coupled to provide a plurality of pairs of master reference differential signals to the plurality of comparators in place of the differential input signal during calibration.

4. The ADC of claim 1, wherein the self-calibration circuit includes a plurality of resistor tap selection circuits to select the differential reference signals.

5. The ADC of claim 4, wherein the adjustable reference signal generator includes at least one pair of resistor strings which are tapped to provide the different reference signals, each string having a first end and a second end, a first end of one string in a pair is positioned adjacent to a second end of the other string in the pair, the first end is at a different potential than the second end.

6. The ADC of claim 5, wherein the at least one pair of resistor strings include a plurality of tap points.

7. The ADC of claim 6, wherein each resistor tap selection circuit includes a tap point storage register to store a tap point value indicative of a tap point to be coupled to a comparator corresponding to the resistor tap selection circuit and wherein each string of the pair of resistor strings is arranged so that any integral non-linearity in one resistor string is symmetrical to any integral non-linearity in the resistor string about the mid-voltage point of one of the two strings.

8. The ADC of claim 6, the resistor tap selection circuit is configured to couple a pair of the plurality of tap points to a corresponding comparator of the plurality of comparators.

9. The ADC of claim 6, wherein each resistor tap selection circuit includes a tap position counter to count a number of tap points and wherein each string of the pair of resistor strings is arranged so that any integral non-linearity in one resistor string is symmetrical to any integral non-linearity in the resistor string about the mid-voltage point of one of the two strings.

10. A process for self-calibrating an analog-to-digital converter (ADC), the process comprising:
   a. applying differential input signals and differential reference signals to a plurality of differential comparators;
   b. generating for each differential comparator a self-calibration signal based on an output signal from the plurality of differential comparators; and
   c. generating differential reference signals based on the self-calibration signal.

11. The process of claim 10 wherein generating a self-calibration signal based on an output signal includes determining whether the output signal of the plurality of comparators transitions from a first state to a second state.

12. The process of claim 11 wherein, if the output signal does not transition from a first state to a second state, then generating the differential reference signals based on the self-calibration signal includes generating a self calibration signal that causes a change in a value of the differential reference signals.

13. The process of claim 12 further including repeating b. and c. until the differential output signal transition from the first to the second state.

14. The process of claim 11 wherein, if the output signal does not transition from the first state to the second state, then determining whether a first number of reference voltages signals have been applied to the plurality of comparators.

15. The process of claim 14, wherein, if not all reference voltage signals of the first number of reference voltage signals have been applied to the plurality of comparators, then applying a next reference voltage signal to the comparator.

16. An analog-to-digital converter (ADC) comprising:
   a plurality of differential comparators to receive differential input signals and differential reference signals and to generate one output signal;
   a self-calibration circuit to receive from each of the plurality of differential comparators the output signal and responsive thereto to generate a self-calibration signal; and
   a pair of resistor strings to provide differential reference signals based on the self-calibration signals.

17. The ADC of claim 16, the self-calibration circuit includes self-calibration control circuit to receive the output signal and responsive thereto to generate a self-calibration signal.

18. The ADC of claim 17, wherein the at least one pair of resistor strings includes a plurality of tap points.

19. The ADC of claim 17, wherein the self-calibration circuit includes a resistor tap selection circuit to select a pair of the tap points.

20. The ADC of claim 19, wherein the resistor tap selection circuit includes a tap point storage register to store a value indicative of a pair of tap points to be coupled to a corresponding differential comparator and wherein each string of the pair of resistor strings is arranged so that any integral non-linearity in one resistor string is symmetrical to any integral non-linearity in the resistor string about the mid-voltage point of one of the two strings.

* * * * *